United States Patent
Wiezell et al.

(10) Patent No.: US 10,753,966 B2
(45) Date of Patent: Aug. 25, 2020

(54) DUTY CYCLE ESTIMATION

(71) Applicant: Sequans Communications S.A., Colombes (FR)

(72) Inventors: Martin Wiezell, Colombes (FR); Ali Reza Bastami, Colombes (FR)

(73) Assignee: SEQUANS COMMUNICATIONS S.A., Colombes (FR)

( * ) Notice: Subject to any disclaimer, the term of this patent is extended or adjusted under 35 U.S.C. 154(b) by 0 days.

(21) Appl. No.: 16/206,575

(22) Filed: Nov. 30, 2018

(65) Prior Publication Data

US 2020/0174051 A1    Jun. 4, 2020

(51) Int. Cl.
| | |
|---|---|
| *G01R 29/027* | (2006.01) |
| *H04L 7/033* | (2006.01) |
| *H04L 25/02* | (2006.01) |
| *H03K 5/156* | (2006.01) |

(52) U.S. Cl.
CPC ....... *G01R 29/0273* (2013.01); *H03K 5/1565* (2013.01); *H04L 7/0332* (2013.01); *H04L 25/0292* (2013.01)

(58) Field of Classification Search
CPC ...... G01R 29/00; G01R 29/0273; H03K 5/00; H03K 5/1565; H04L 25/00; H04L 25/0292; H04L 7/00; H04L 7/0332

USPC .......................................................... 327/34
See application file for complete search history.

(56) References Cited

U.S. PATENT DOCUMENTS

| | | | |
|---|---|---|---|
| 2019/0187628 A1* | 6/2019 | Chu ...................... | G04F 10/005 |
| 2019/0243312 A1* | 8/2019 | Chu ...................... | G04F 10/02 |

\* cited by examiner

*Primary Examiner* — Lincoln D Donovan
*Assistant Examiner* — Dave Mattison
(74) *Attorney, Agent, or Firm* — Hamilton, Brook, Smith & Reynolds, P.C.

(57) ABSTRACT

A duty cycle measuring circuit, the circuit comprising a synchronizer and a measurer, the synchronizer arranged such that when a signal to be measured comprising pulses having a pulse width and a pulse period is input to the synchronizer, synchronizing signals corresponding to each of pulse rising edge, pulse falling edge, pulse period start and pulse period end are output from the synchronizer, each synchronizing signal comprising a rising or falling edge, wherein the synchronizing signal outputs from the synchronizer are input to the measurer, and wherein the measurer is arranged to provide two measurement outputs based on the synchronizing signal inputs from the synchronizer, the measurement outputs comprising a first measurement output signal indicative of a pulse period measurement of the signal to be measured and a second measurement output signal indicative of a pulse width measurement of the signal to be measured.

20 Claims, 11 Drawing Sheets

DUTY CYCLE ESTIMATION

TECHNICAL FIELD

This disclosure relates to duty cycle measurement, particularly at gigahertz frequencies. It is particularly suited, but by no means limited, to implementation in a mixer of a receiver.

BACKGROUND

Gigahertz frequencies are used in many electronic systems these days. In order to be able to measure gigahertz frequencies directly, a resolution of a few pico seconds is needed.

Often, accurate measurement of these frequencies is beneficial to the working of components of a system. For example, in communications systems, a key parameter for mixer performance is the quality of non-overlapping clocks.

Pulses too far apart will result in increased noise figure (output noise compared to ideal output noise when connected to matched sources at the standard noise temperature as would be understood) and/or phase noise. Similarly, pulses too close to each other may result in the mixer output being short circuited for the time interval in question, resulting in lower gain, as well as increased noise figure and increased phase noise.

Accurately knowing the duty cycle of the clocks in such systems would help achieve optimum performance.

One method of duty-cycle measurement in a system is to vary the duty-cycle shape and time until the desired performance is achieved. This is an example of indirect measurement, which is not desirable.

Another way of indirect measurement of the duty cycle is to charge a capacitor through a known resistor. This gives the integral average of the pulse, but does not provide information as to the exact pulse shape, rise/fall time or duty cycle.

Accordingly, there is a need to provide an accurate way of directly measuring duty cycles at higher frequencies, such as gigahertz frequencies.

SUMMARY

According to an aspect there is provided a duty cycle measuring circuit, the circuit comprising, a synchronizer and a measurer, the synchronizer arranged such that when a signal to be measured comprising pulses having a pulse width and a pulse period is input to the synchronizer, synchronizing signals corresponding to each of pulse rising edge, pulse falling edge, pulse period start and pulse period end are output from the synchronizer, each synchronizing signal comprising a rising or falling edge, wherein the synchronizing signal outputs from the synchronizer are input to the measurer, and wherein the measurer is arranged to provide two measurement outputs based on the synchronizing signal inputs from the synchronizer, the measurement outputs comprising a first measurement output signal indicative of a pulse period measurement of the signal to be measured and a second measurement output signal indicative of a pulse width measurement of the signal to be measured.

Optionally, the duty cycle measuring circuit further comprises a calculator arranged to calculate the duty cycle of the signal to be measured based on the first output signal and the second output signal.

Optionally, wherein the first and second outputs from the measurer each comprise a digital number.

Optionally, the duty cycle measuring circuit wherein the measurer comprises a time to digital converter, TDC circuit.

Optionally, the duty cycle measuring circuit wherein the TDC comprises a plurality of series of cascaded Vernier delay cells, each series coupled to either the pair of pulse edge signals or the pair of pulse period signals of the synchronizing signal inputs to the measurer.

Optionally, the duty cycle measuring circuit wherein the synchronizer comprises a plurality of D-type latches arranged to provide the synchronizing signals corresponding to each of pulse rising edge, pulse falling edge, pulse period start and pulse period end.

Optionally, the duty cycle measuring circuit wherein a series of two cascaded d-type latches, each clocked by the rising edge of the signal to be measured are arranged to provide the signal corresponding to pulse period end from the inverting output of the second d-type latch.

Optionally, the duty cycle measuring circuit wherein a d-type latch clocked by the rising edge of the signal to be measured is arranged to provide the signal corresponding to pulse period start from its non-inverting output.

Optionally, the duty cycle measuring circuit wherein a d-type latch clocked by the falling edge of the signal to be measured is arranged to provide the signal corresponding to pulse falling edge from its inverting output.

Optionally, the duty cycle measuring circuit wherein a d-type latch clocked by the rising edge of the signal to be measured is arranged to provide the signal corresponding to pulse rising edge from its non-inverting output via a delay element.

According to a second aspect there is provided a method of measuring the duty cycle of a signal to be measured, the method comprising providing to a synchronizer a signal to be measured comprising pulses having a pulse width and a pulse period, outputting from the synchronizer synchronizing signals corresponding to each of pulse rising edge, pulse falling edge, pulse period start and pulse period end, each synchronizing signal comprising a rising or falling edge, providing the synchronizing signal outputs to a measurer, the measurer providing two measurement outputs based on the synchronizing signal inputs from the synchronizer, the measurement outputs comprising a first measurement output signal indicative of a pulse period measurement of the signal to be measured and a second measurer signal indicative of a pulse width measurement of the signal to be measured.

Optionally, the method further comprising calculating, by a processor, the duty cycle of the signal to be measured based on the first output signal and the second output signal.

Optionally, the method wherein providing the two measurement outputs comprises providing a first measurement output signal indicative of a pulse period measurement and a second measurement output signal indicative of a pulse width measurement, each comprising a digital number.

Optionally, the method wherein providing a measurer comprises providing a time to digital, TDC circuit.

Optionally, the method wherein providing the TDC comprises providing a plurality of series of cascaded Vernier delay cells each series coupled to either the pair of pulse edge signals or the pair of pulse period signals of the synchronizing signal inputs to the measurer.

Optionally, the method wherein the synchronizer comprises providing a plurality of D-type latches arranged to provide the synchronizing signals corresponding to each of pulse rising edge, pulse falling edge, pulse period start and pulse period end.

Optionally, the method wherein the synchronizer comprises providing a series of two cascaded d-type latches, each clocked by the rising edge of the signal to be measured, the series arranged to provide the signal corresponding to pulse period end from the inverting output of the second d-type latch.

Optionally, the method wherein the synchronizer comprises providing a d-type latch clocked by the rising edge of the signal to be measured to provide the signal corresponding to pulse period start from its non-inverting output.

Optionally, the method wherein the synchronizer comprises providing a d-type latch clocked by the falling edge of the signal to be measured to provide the signal corresponding to pulse falling edge from its inverting output.

Optionally, the method wherein the synchronizer comprises providing a d-type latch clocked by the rising edge of the signal to be measured to provide the signal corresponding to pulse rising edge from its non-inverting output via a delay element.

According to a third aspect there is provided a non-transitory computer readable medium comprising computer readable instructions that when executed by a processor, cause the processor to perform the method of claim 11.

Set out below are a series of clauses that disclose features of further aspects of the invention, which may be claimed. The clauses that refer to one or more preceding clause contain optional features.

With all clauses, preferable and optional features are defined in the dependent claims.

BRIEF DESCRIPTION OF THE DRAWINGS

Embodiments will now be described, by way of example only, and with reference to the drawings in which.

In the figures, like elements are indicated by like reference numerals throughout.

Overview

The disclosed system and method comprises taking a signal to be measured, preferably a plurality of pulses having a pulse width and a pulse period, providing these pulses to a synchronization module, herein also known as a synchronizer. A synchronization module providing output synchronizing signals comprising a rising edge or a falling edge that correspond to each of the pulse rising edge, the pulse falling edge, the pulse period start, and pulse period end of the signal to be measured. These output synchronizing signals are input to a measurement module, herein also known as a measurer. The measurement module provides two measurement outputs based on the output synchronizing signals from the synchronizing module. A first measurement output comprises a first measurement signal indicative of a pulse period measurement of the signal to be measured and a second measurement output signal indicative of a pulse width measurement of the signal to be measured. With these two outputs, direct measurement of duty cycle at higher frequencies such as gigahertz frequencies is provided with improved benefits including reduced silicon and pcb real-estate, and reduced current consumption. Direct measurement of the rising and falling edge times of the pulses of the signal to be measured can also be calculated accurately.

DETAILED DESCRIPTION

Figure 1:
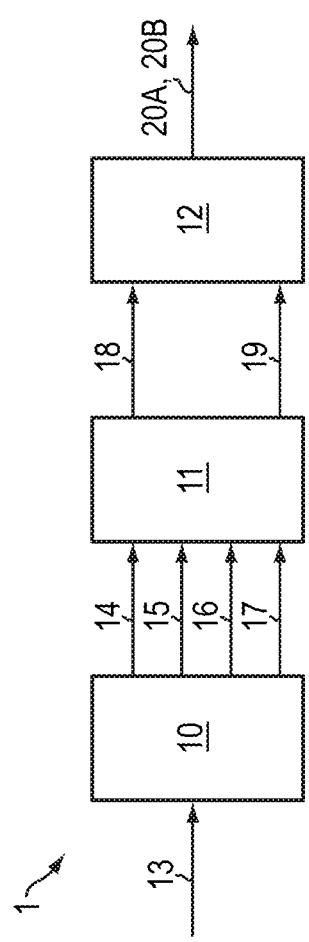
FIG. 1 illustrates a duty cycle measurement circuit according to examples.

Turning to FIG. 1, duty cycle measurement circuit 1 is illustrated. The circuit comprises a synchronizing module 10, a measurement module 11 and an optional calculation module 12, herein also known as a calculator. Wherever the terms synchronizing module, measuring module and calculating module appear, they may be substituted for synchronizer, measurer and calculator respectively. Synchronizing module 10 comprises at least one input coupled to signal 13 and at least four outputs for providing signals 14-17. Measurement module 11 comprises at least four inputs coupled to signals 14 to 17 and at least two outputs for providing signals 18 and 19. Optional calculation module 12 comprises at least two inputs coupled to signals 18 and 19, and an output for providing signal 20A, 20B.

Figure 3:
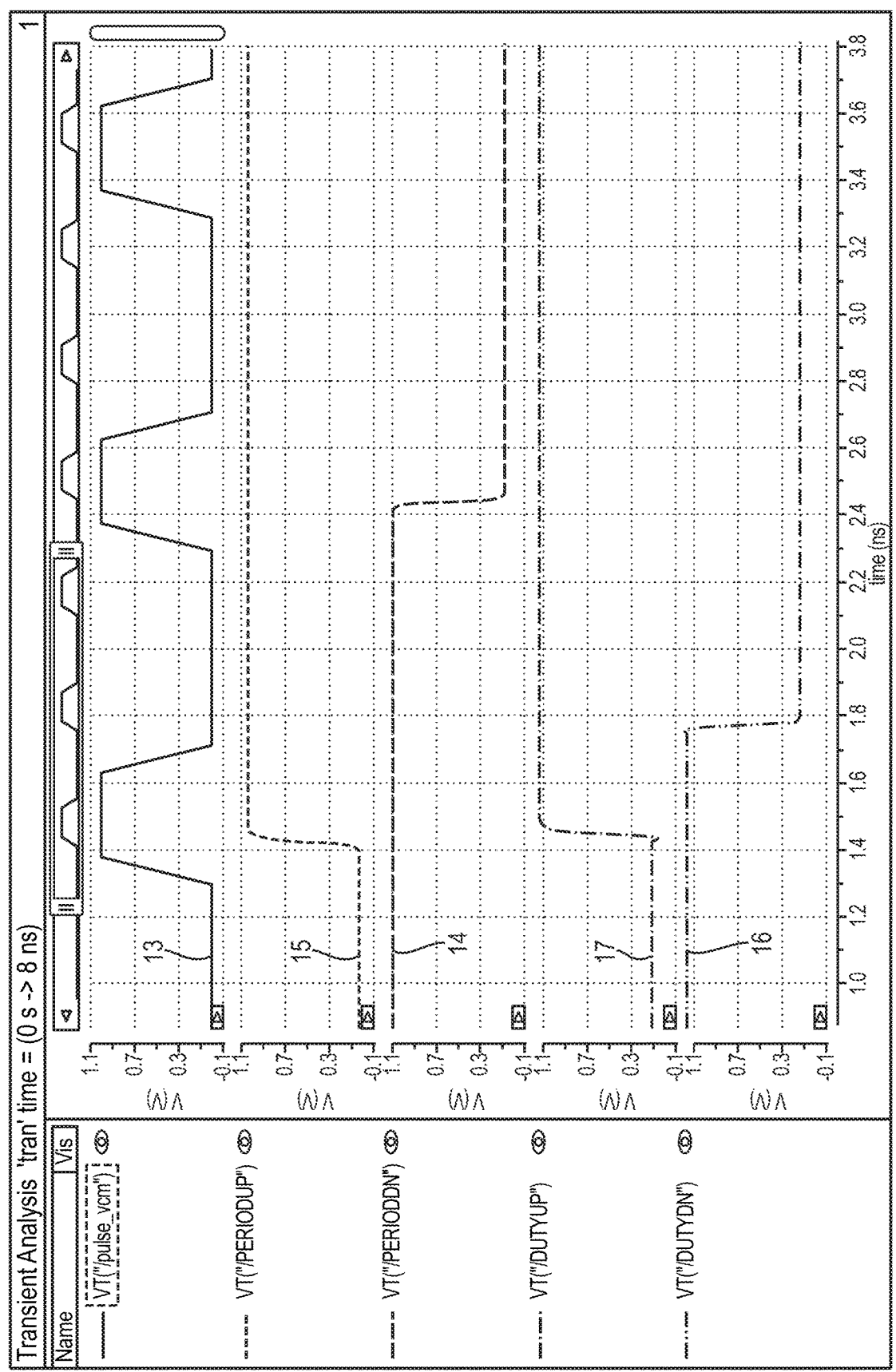
FIG. 3 illustrates waveforms associated with the input and outputs of the synchronization module according to embodiments.

A signal to be measured 13 comprising pulses having a pulse width and a pulse period is input to the synchronizing module 10. Synchronizing module 10 is arranged to provide outputs corresponding to each of a pulse rising edge 17, a pulse falling edge 16 (of the same pulse), pulse period start 15 and pulse period end 14. The pulse period start and pulse period end outputs may correspond to consecutive rising or falling edges of the signal 13. 'Corresponding to' may comprise being substantially in time alignment with. FIG. 3 illustrates, on a time-voltage axis how signals 14 to 17 correspond to signal to be measured 13. In this example, the signal to be measured has a duty cycle of 32%, a rise time ($t_{rise}$) of 80 ps and a fall time ($t_{fall}$) of 70 ps.

The four signals 14 to 17, which may comprise a rising or a falling edge, are fed into measurement module 11. Measurement module 11 is arranged to provide two output signals 18, 19 based on signal 14 to 17. A first measurement output signal 19 indicative of a pulse period of signal to be measured 13, and a second measurement output signal 18 indicative of a pulse width of signal to be measured 13. Signals 18 and 19 maybe in the form of a digital number, for example they may be a binary or hexadecimal number, or any other form of bit pattern. Further, signals 18 and 19 may comprise a serial bit stream over one signal or 255 individual signal outputs (the same number of individual signal outputs as the number of Vernier delay cells).

In either case, a sampling circuit can be employed to sample every $t_0$ to obtain an integer value of the signal 18, 19 as would be understood. Alternatively, signals 18 and/or 19 may be asynchronously sampled. Optional calculation module 12 may comprise such a sampling circuit and may therefore take signals 18 and 19 as two inputs to calculate the duty cycle of the pulses of signal to be measured 13 by way of calculating (indicative value of) signal 18/(indicative value of) signal 19. The duty cycle calculation may be provided to an output signal 20A, 20B. Alternatively, calculation module 12 may output the integer value of signals 18 and 19 on corresponding outputs 20A, 20B.

As would be understood, an ASIC, FPGA, PLD, microcontroller, microprocessor, processor or other programmable or OTP programmable processing device may be used to implement any or each of the synchronization module 10, the measurement module 11 and the optional calculating module 12. Further, any combination of a single or a plurality of programmable devices may be used to implement any or all of the modules 10, 11, 12.

Figure 2:
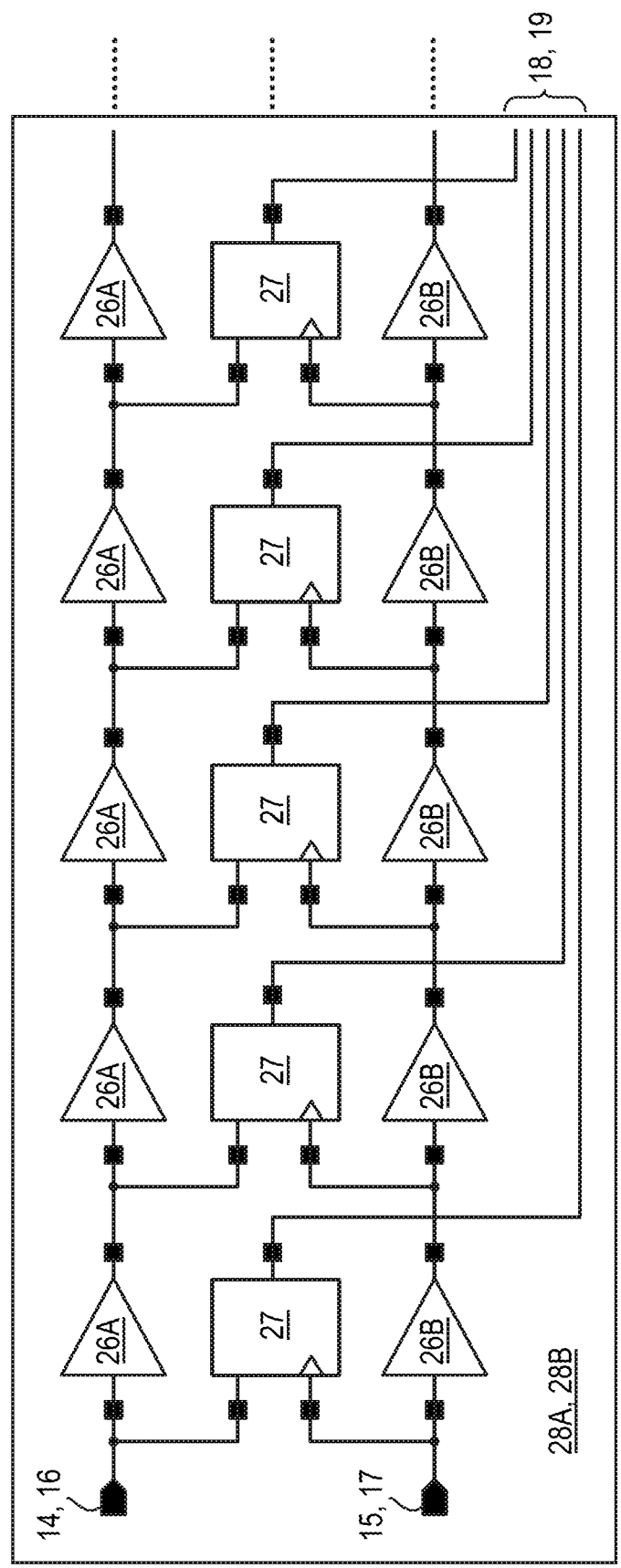
FIG. 2 illustrates a synchronization module and a measurement module according to examples.

Turning to FIG. 2, in one embodiment, synchronization module 10 comprises a plurality of D-type latches arranged to provide the synchronizing signals 14 to 17 of FIG. 3 and corresponding to each of the pulse rising edge, pulse falling edge, pulse period start and pulse period end of the signal to be measured 13. Alternative arrangements of latches, be they D-type or other type could be used as appropriate. As would be understood, the signals labelled VD1A1DIG are the +v signals, and the signal labelled AVSSDIG are the 0 v or ground signals. RESETN is an active low reset signal. RESETN is used to initialise the synchronization module and the measurement module so that a pulse of the signal 13 can be measured. TDEL can be ignored as this signal is present for simulation purposes only. In multi-phase mixer configurations, such as a 4-phase configuration, 4 pulses of signal 13 are characterised. In this case, signal to be measured 13 is provided to synchronizing module 10 one by one, each may be separated by a RESETN initiation.

Signal 14, the signal corresponding to the pulse period end, is provided from the inverting output of a second D-type latch of a series of two cascaded D-type latches 21, 22, each clocked by a rising edge of signal 13. Signal 29 is passed from latch 21 to latch 22.

Signal 15, the signal corresponding to the pulse period start, is provided from the non-inverting output of a D-type latch 23 clocked by the rising edge of signal 13.

Signal 16, the signal corresponding to the pulse falling edge, is provided from the inverting output of a D-type latch 24 clocked by the falling edge of signal 13, wherein the D input of D-type latch 24 is coupled to signal 29, the signal from the non-inverting output of the first (21) of the two cascaded D-type latches 21, 22. Signal 29 is used to ensure that when RESETN is active low, a desired state (high) of the D input of latch 24 is present when the falling edge signal of signal 13 clock latch 24 to result in a desired output on the inverting output of latch 24.

Signal 17, the signal corresponding to the pulse rising edge, is provided from the output of a delay element 25A the input of which is coupled to the non-inverting output of a D-type latch 25 clocked by the rising edge of signal 13. Delay element 25A is provided to cater for the differing timings of inverting inputs and outputs versus non-inverting inputs and outputs as would be understood. Latch 24 is clocked on the falling edge of signal 13 and also utilizes its inverting output to provide signal 16, meanwhile signal 17 is produced by a positive edge triggered latch 25 and from non-inverting output of latch 25. Delay element 25A ensures that signals 16 and 17 occur in the correct order, that is signal 17 going high before signal 16.

Figure 2A:
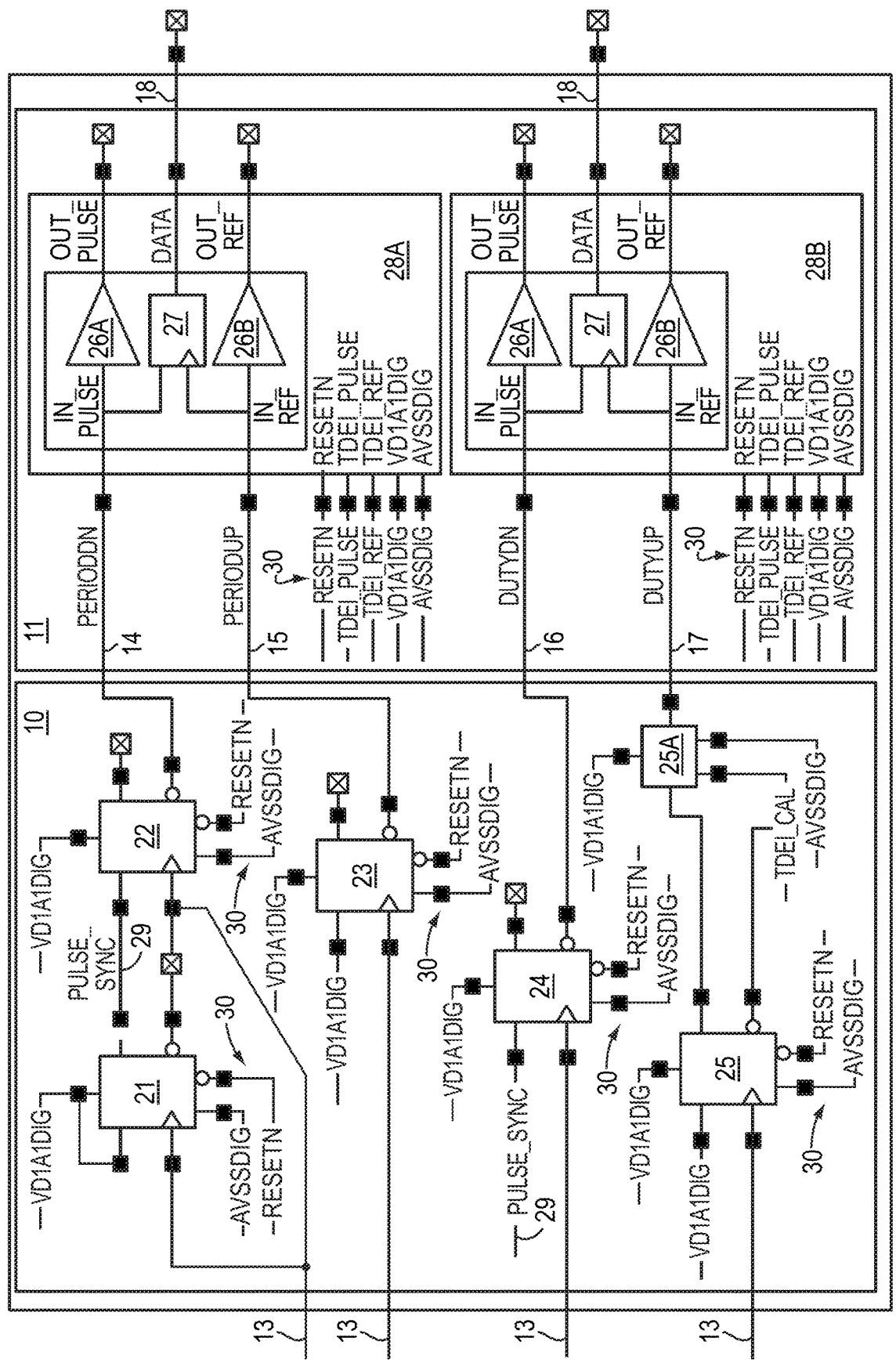
FIG. 2A illustrates a Vernier delay cell implementation of the measurement module according to examples.

Still referring to FIG. 2, measurement module 11 comprises a time to digital converter, TDC. The TDC may comprise a plurality of series (28A, 28B) of Vernier delay cells or other delay arrangement to determine delta between two related input edges. In the case of a Vernier arrangement, each Vernier delay cell comprises a D-type latch 27 and two delay elements 26A, 26B. The delay elements have differing delays as would be understood. The input of each pair of signals 16,17 and 14,15 that has a rising edge has a larger delay (one of 26A, 26B) than the delay (the other of 26A,26B) associated with the input of the other signal of each pair that has a falling edge. This is to ensure that the internal signals of the Vernier arrangement. Signals pairs 16,17 and 14,15 and their corresponding delays may be swapped with one another within each pair. Each series preferably in a cascaded arrangement (FIG. 2A shows 5 cells cascaded as an example) and coupled to the pair of pulse edge signals 14, 15 (series 28A) or the pair of pulse period signals 16, 17 (series 28B). There may be any number of Vernier delay cells in each series, for example the number may be 256 or up to 500. The number of Vernier delay cells per series is based on the desired dynamic range of the signals (14 to 19) that contribute to duty cycle measurement.

Figure 3A:
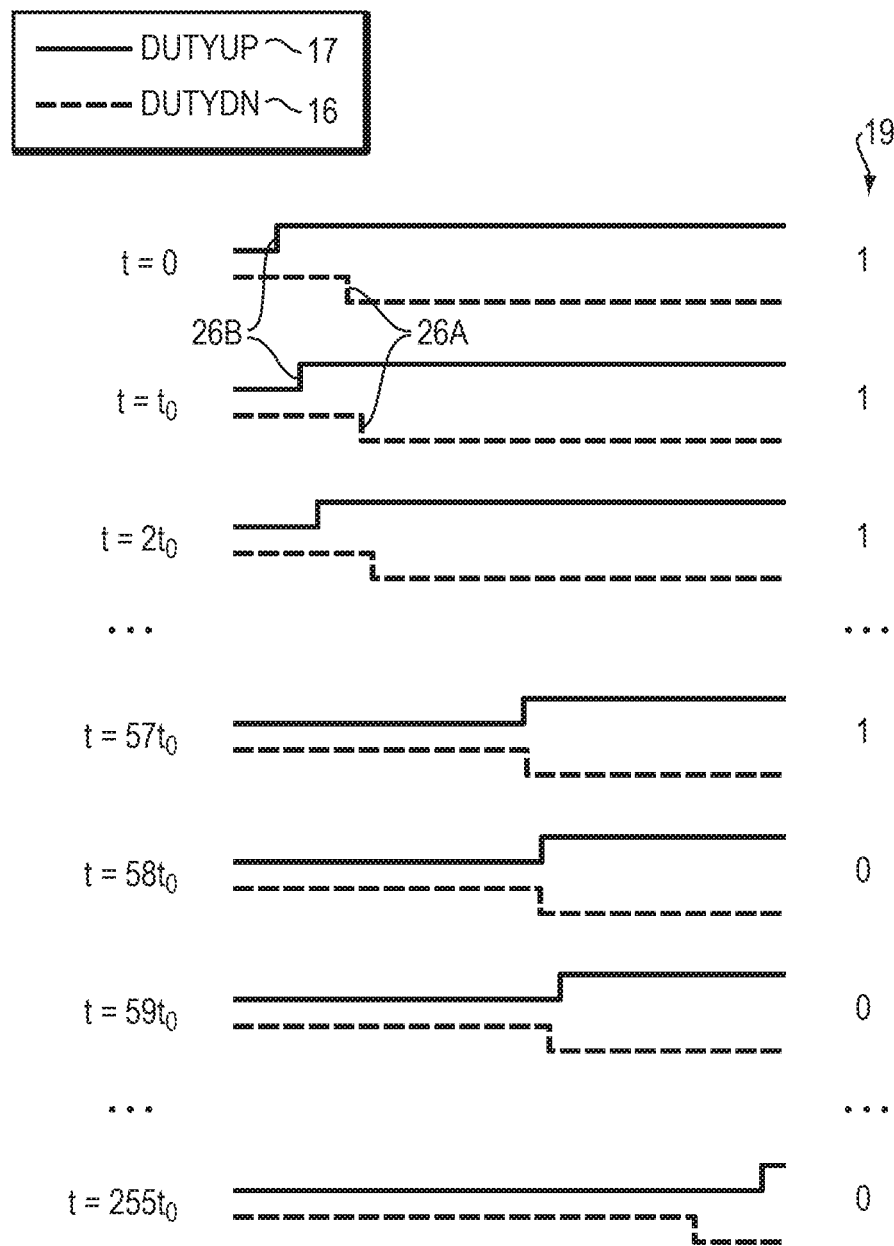
FIG. 3A illustrates the input and output waveforms of the cascaded Vernier delay cells.

FIG. 3A illustrates the input and output waveforms of the cascaded Vernier delay cells as would be understood. As can be seen, measurement output signal 19 comprises an output count of Vernier delay series 28B from pulse period start signal 17 to pulse period end signal 16 and is indicative of the pulse period. In the example of FIG. 3A, bit stream of length 256: "111 . . . 100 . . . 0" may be converted to an 8-bit number (decimal "57")="00111001", or a 9, 10 or any other bit width number depending on the desired resolution. Correspondingly, measurement output signal 18 (not shown) comprises an output count of Vernier delay series 28A from pulse period start signal 17 to pulse period end signal 16 and is indicative of the pulse period.

Figure 4:
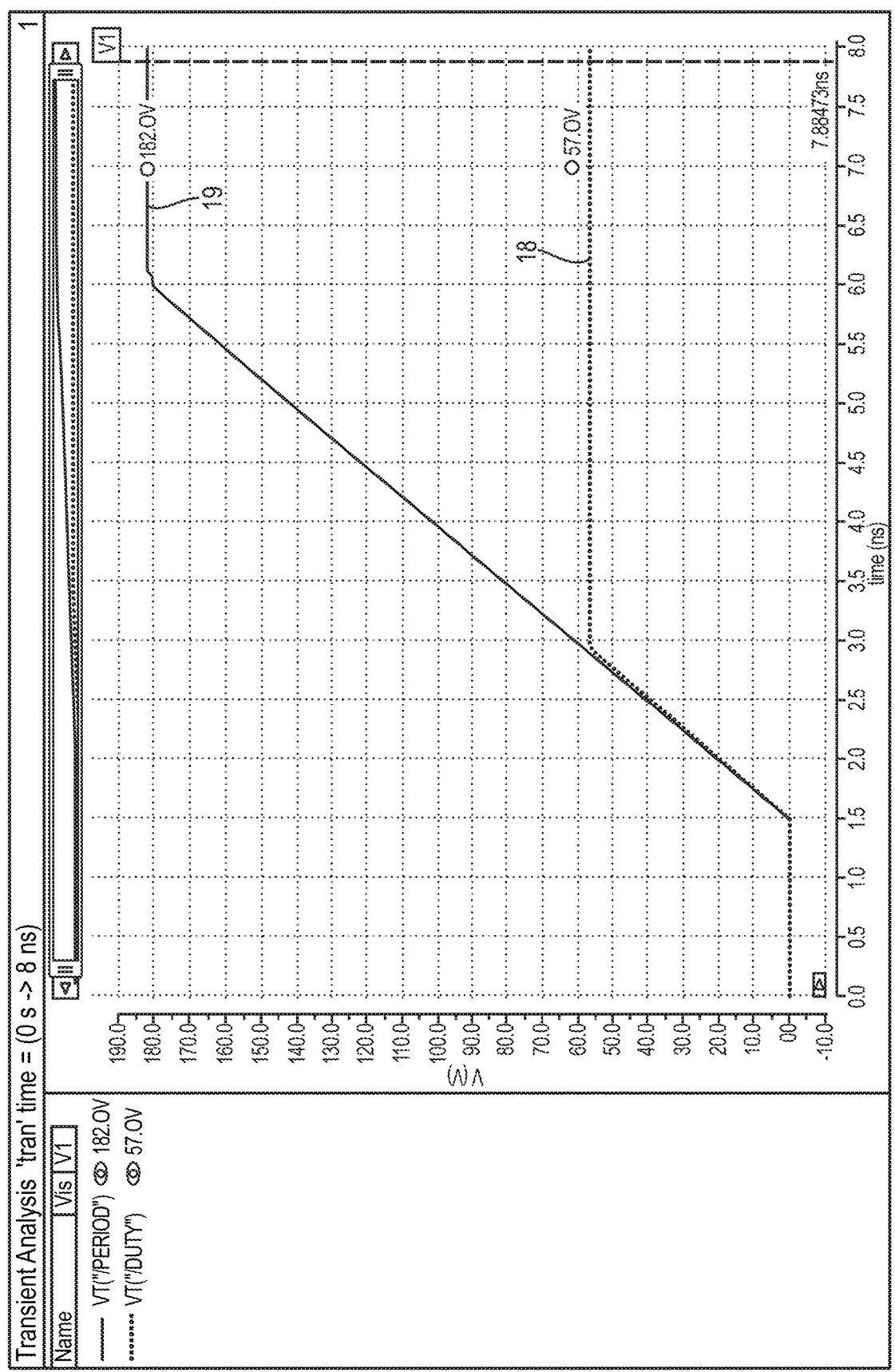
FIG. 4 illustrates outputs 18, 19 for a measurement module comprising two series of series of 256 Vernier delay cells.

FIG. 4 illustrates measurement module outputs 18, 19 for an example of 256 Vernier delay cells per series 28A, 28B. Delay between delay elements 26A and 26B is 5 ps. The duty cycle is calculated as:

$$(\text{value of signal 18})/(\text{value of signal 19})=57/182=31.3\%+/-0.7\%$$

The expected value is 32% at mid-voltage 0.5 v. As would be understood, the latches of both the synchronization module and the measurement module do not trigger exactly at mid-voltage which results in a small static offset. The +/−0.7% is the resolution set by quantization error.

Figure 5:
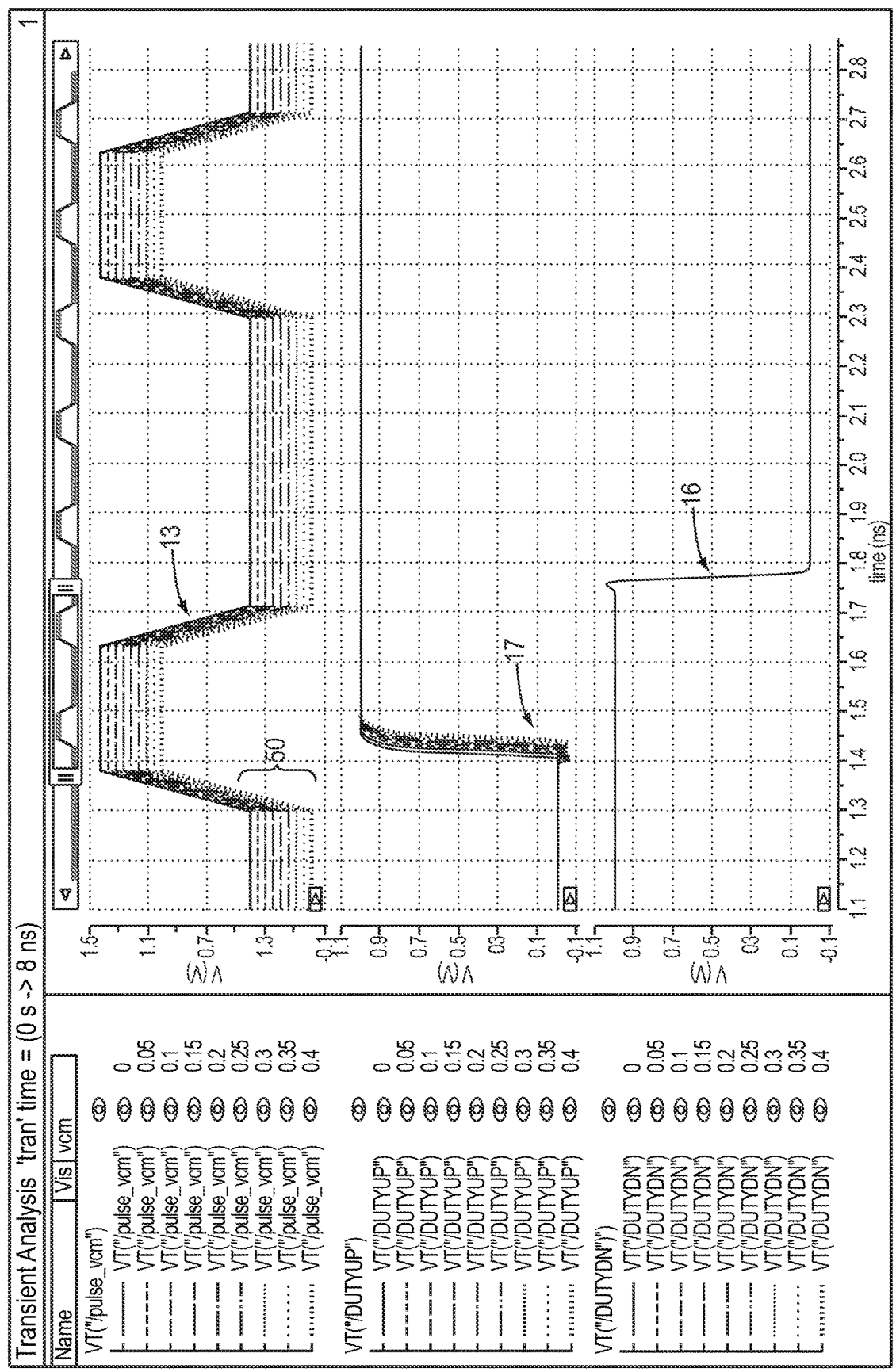
FIG. 5 illustrates a swept signal 13 dc level for influencing the pulse start rising edge.

Turning to FIG. 5, if the dc level of the signal to be measured 13 is changed (swept), the latches in synchronization module 10 will trigger at different voltage levels. It follows that the measured duty cycle (value of signal 18/value of signal 19) will also vary with dc level. This is a way of directly measuring signal 13 pulse rise and fall times. In FIG. 5, $t_{rise}$=80 ps, and the dc level is swept (50) from 0 to 0.4 v for input signal 13 to latch 25 (for pulse start signal 17). As can be seen, with the swept dc level, the rising edge of signal 17 (pulse start) occurs at slightly different times. As a result, the duty cycle measurement signal 20A (value of signal 18)/(value of signal 19) varies from 57 to 63 as per FIG. 6.

If it is assumed that $t_{rise}$ straight line as an approximation, then duty cycle 20A can be approximated as a straight line. The gradient of that straight line, $k_{rise}$ can be calculated by the least square method, and then $$t_{rise}=k_{rise}/(182*1\text{ GHz})=80.8\text{ ps}$$

where the period is measured as 182, and $k_{rise}$ is 14.7 digital steps from 0 v to Vdd (which in this example is 1.1 v).

It would be understood that the least square method is appropriate when the gradient to be estimated approximates a straight line. Other appropriate estimation methods can be used as appropriate.

Duty cycle calculated using signals 18 and 19, and hence the calculated value of $t_{rise}$ of the pulses of signal 13 is accurate compared to the actual pulse rise time of 80.0 ps and is as a result of quantization error being averaged away by the least square method.

Figure 7:
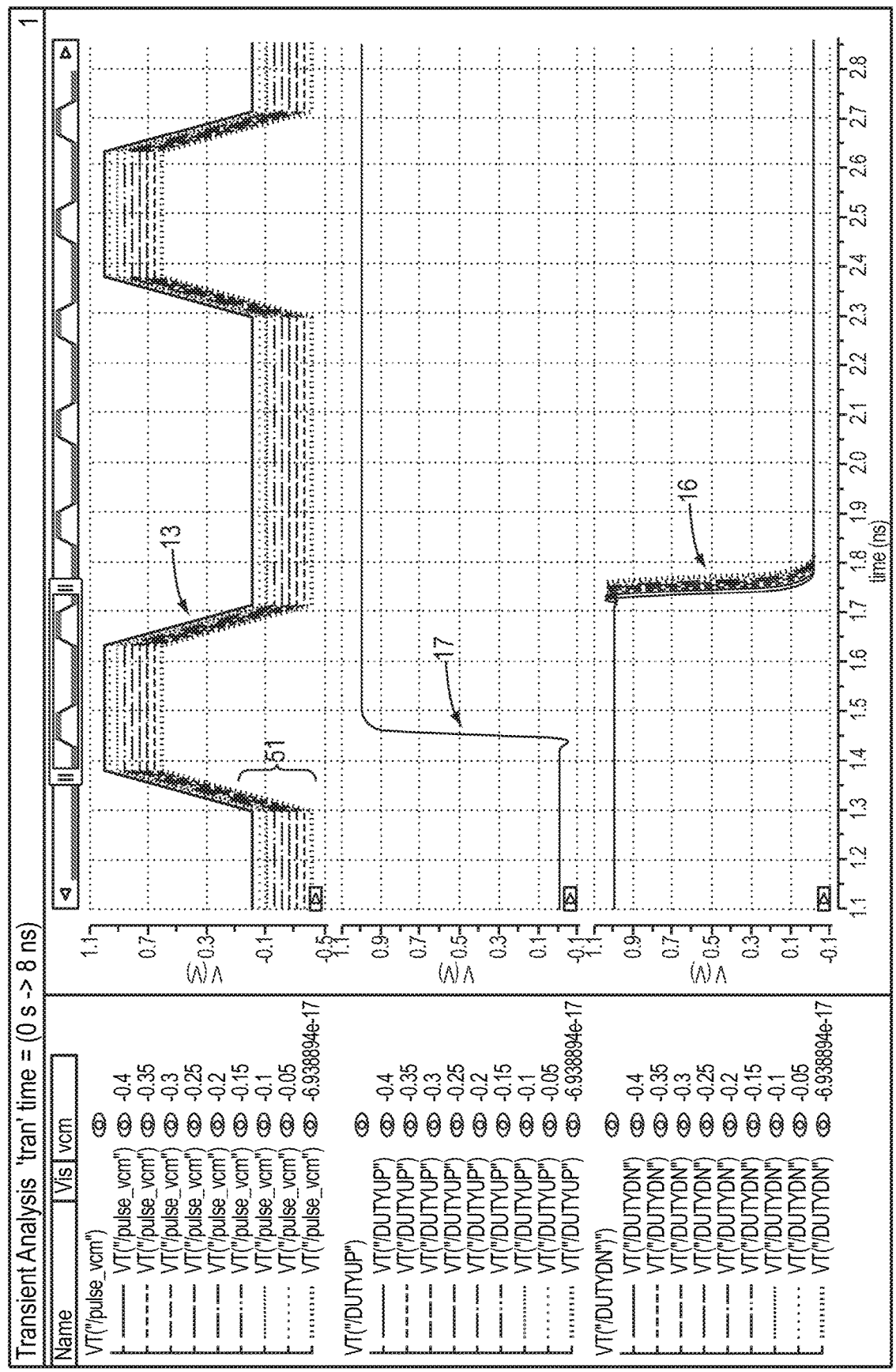
FIG. 7 illustrates a swept signal 13 dc level for influencing the pulse end falling edge.

In FIG. 7, $t_{fall}$=70 ps, and the dc level is swept (51) from −0.4 to 0 v for input signal 13 to latch 24 (for pulse period end signal 16). As can be seen, with a varying signal 16, the duty cycle measurement signal 20B (value of signal 18)/ (value of signal 19) also varies from 52 to 57 as per FIG. 8 (mV on the x-axis).

Figure 6:
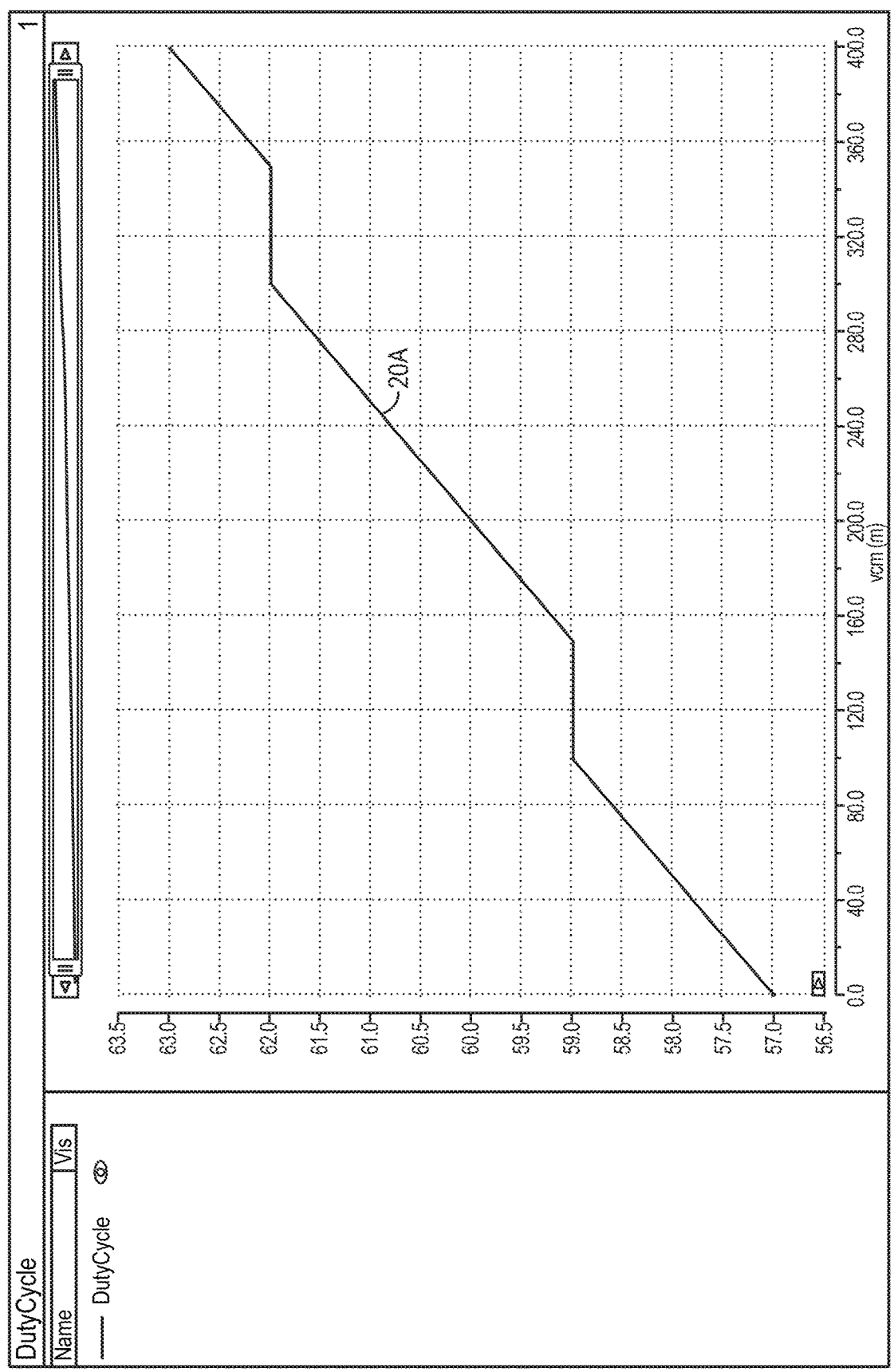
FIG. 6 illustrates duty cycle measurement for FIG. 5 parameters.

As for FIG. 6, if it is assumed that $t_{fall}$ t a straight line as an approximation, is then duty cycle 20B can be approximated as a straight line. The gradient of that straight line, $k_{rise}$ can be calculated by the least square method (or other appropriate method as discussed earlier) which in this case is 13 digital steps as the gradient is more steep than for $k_{rise}$, and then $$t_{fall}=k_{fall}/182*1 \text{ ns}=71.4 \text{ ps}$$

where the period is measured as 182, and $k_{fall}$ is 13 digital steps from Vdd to 0 v (where Vdd=1.1 v).

Duty cycle calculated using signals 18 and 19, and hence the calculated value of $t_{fall}$ of the pulses of signal 13 is accurate compared to the actual pulse fall time of 80.0 ps and is as a result of quantization error being averaged away by the least square method.

Figure 8:
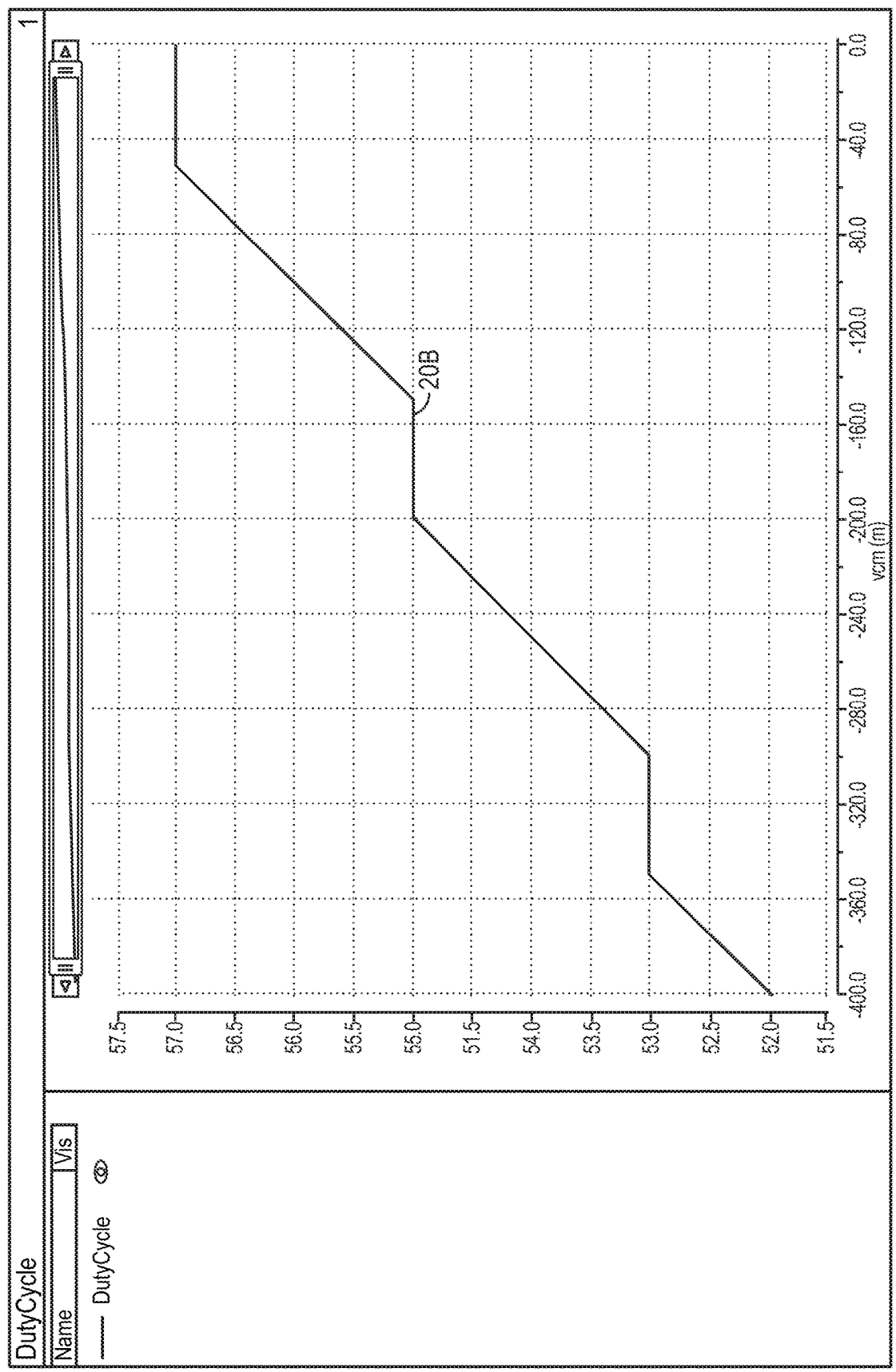
FIG. 8 illustrates duty cycle measurement for FIG. 7 parameters.
Figure 9:
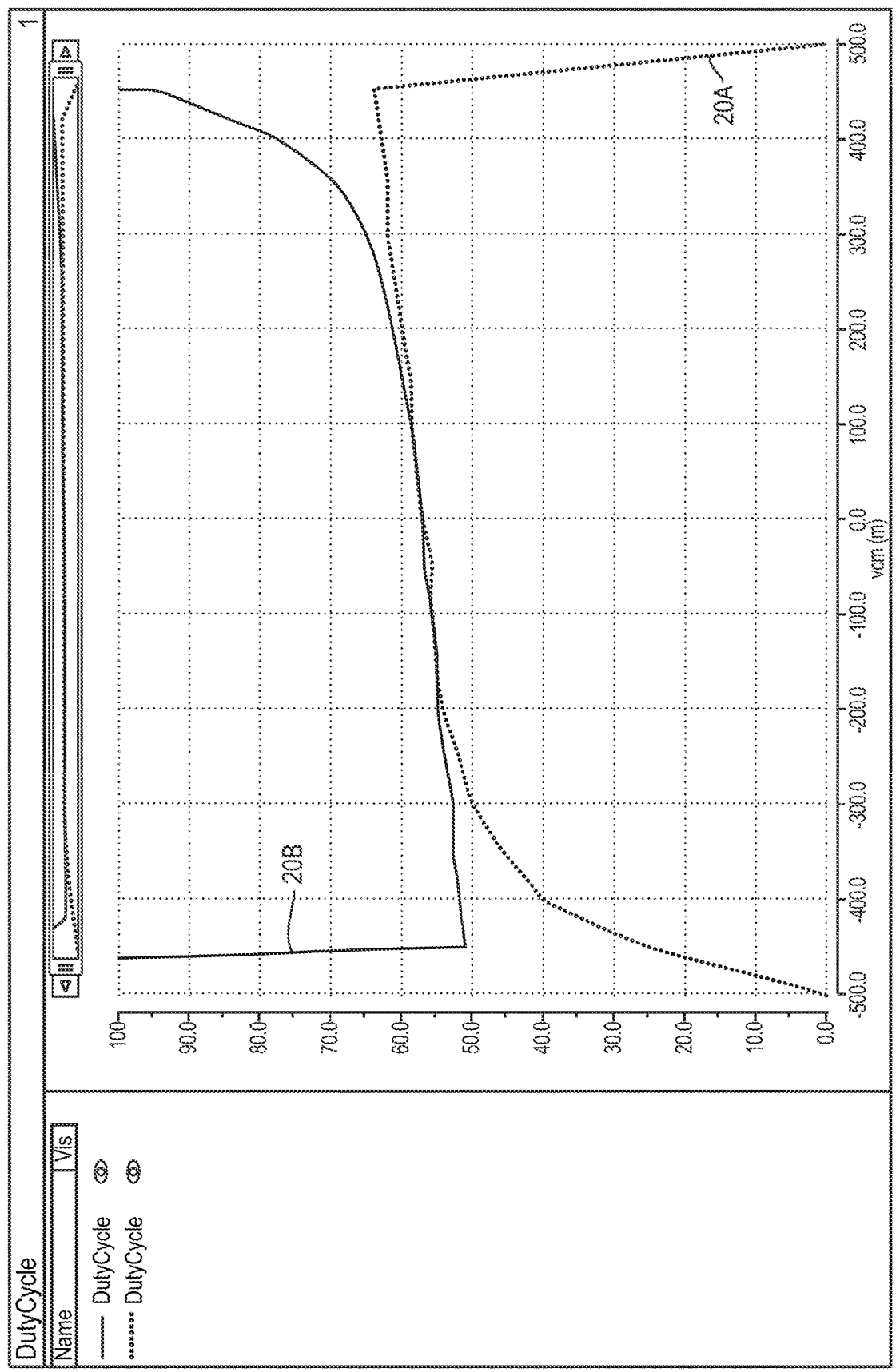
FIG. 9 illustrates a zoomed-out plot of FIGS. 6 and 8.

Turning to FIG. 9 which illustrates a zoomed-out plot of FIG. 6 (20B) and FIG. 8 (20A) with mV on the x-axis, it can be seen how the calculated duty cycle varies with a swept dc level. As shown, this enables calculation of signal 13 pulse rise and fall times. The approximation to a straight line is only valid for the swept voltage range −0.4 v<V($t_{fall}$)<0 v and 0 v<V($t_{rise}$)<0.4 v. For absolute voltages >0.5 v the approximation fails. From the symmetrical shape, we can infer symmetry between positive and negative trigging of the latches and indicates that the previous straight-line approximation is valid for both $t_{rise}$ and $t_{fall}$ and indicates characteristics for the pulse shape. It is note that FIG. 9 is not entirely symmetrical as in the example, $t_{rise}$ is 80 ps and $t_{fall}$ is 70 ps.

In relation to the sweeping of voltages, and the voltage range that can be swept, in other examples, with other logic levels and sweeping ranges, when the equivalent curve to FIG. 9 is not linear, this is an indication that the signal 13 pulse is not linear and/or that the threshold voltage of the transistors of the underlying hardware influences duty cycle. Further, the logic levels of the system in use influences the sweeping range as would be understood, and the threshold of the latches employed is dependent on the threshold voltage of the transistors.

Therefore, the range of voltage swept can be based on component threshold voltage and logic levels.

In other examples, the difference between the two delay cells (26A, 26B) of each Vernier delay cell 28A, 28B can be varied arbitrarily small in order to get arbitrarily good resolution. In practise, the resolution limit will be (set by the transistor mismatch) in the order of 2 ps since the transistor mismatch of the underlying hardware implementation starts to become dominant. In other words, the mismatch might make pulse edges of the system swap in timing, due to process manufacturing variations resulting in transistor mismatch.

Larger transistors can be used to overcome manufacturing variations as is known, but this adds capacitive loading on the pulses.

A resolution limit lower than 2 ps may be achievable, however, even with an assumption of 2 ps, the rise and fall times of signal 13 are usually in the order of 20-30 ps and are hence well estimated (practically if the resolution is about 10× lower than the actual rise and fall time of signal 13, duty cycle results are accurate.

The resolution of the dynamic range of the output of the duty cycle measurement module that is to say the granularity of the binary bit pattern produced depends on the number of Vernier delay-cells. As would be understood, there is a trade-off between dynamic range and resolution. High range=lower resolution for a given bit width.

For example, increasing the resolution to 2 ps for a 1 GHz pulse, the number of delay-cells would be:

# of Cells=1/(2ps*1 GHz)=500

As each delay cell is very small, roughly 5 µm² each, even 500 Vernier delay cells require a total of less than 0.003 mm². The current consumption for such a cell would be a few mA. The current consumption is not of significance as the pulse shape need only be measured once during calibration, then it is turned off.

Figure 10:
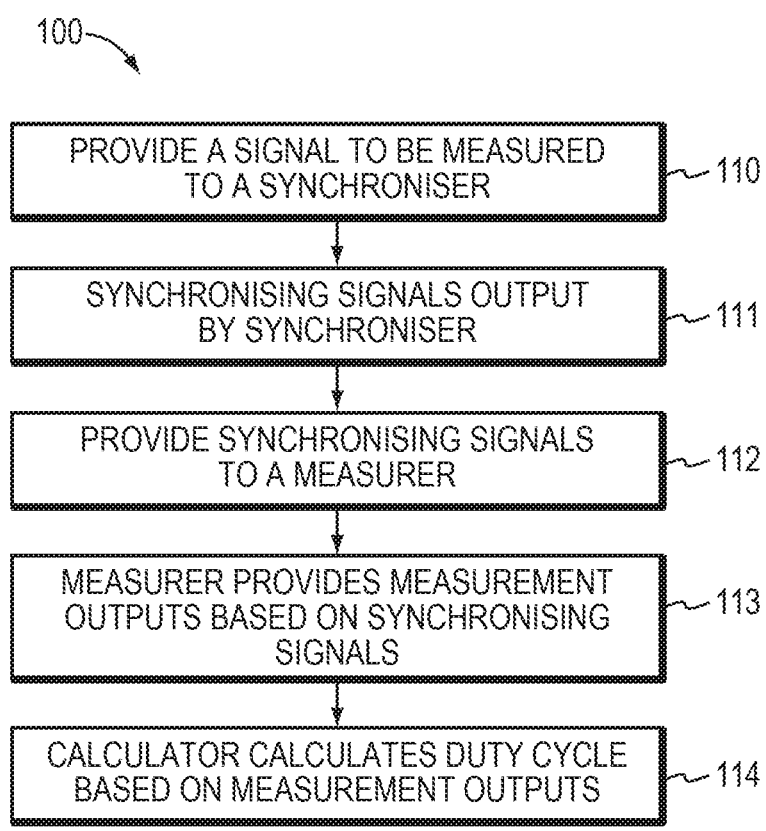
FIG. 10 illustrates a method of measuring a duty cycle.

Turning to FIG. 10, there is also disclosed a method 100 of measuring the duty cycle of a signal to be measured. In a first step 110, a signal to be measured 13 is provided to a synchronizing module 10. The signal comprising pulses having a pulse width and a pulse period. In step 111, the synchronizing module outputs synchronizing signals corresponding to each of pulse rising edge, pulse falling edge, pulse period start and pulse period end of the signal 13, each synchronizing signal having a rising or falling edge. In step 112, the synchronizing signal outputs are provided to a measurement module. In step 113, the measurement module provides two measurement outputs based on the synchronizing signal inputs from the synchronizing module. The measurement outputs comprising a first measurement output signal indicative of a pulse period measurement of the signal to be measured and a second measurement output signal indicative of a pulse width measurement of the signal to be measured. In step 114, the duty cycle of the signal to be measured is calculated based on the first output signal and the second output signal.

As has been discussed, the disclosed system and method provides accurate measurement of pulse shape, in particular gigahertz pulses. This allows optimised phase noise, optimised noise figure, optimised receiver IQ mismatch and optimised IP2. As is known IP2 is the second order intercept point, and is a measure of non-symmetry. IP2 can result from non-identical pulses, which, in turn, could lead to non-25% duty cycle, which as discussed, is sub-optimal for a mixer. Further, the disclosed architecture requires a reduced silicon and printed circuit board real-estate and reduced current consumption.

Additionally, the measurement of pulse rise and fall time can provide information as to the characteristics of the pulses which can convey information pertaining to the quality of components of a system and for understanding the circuit in a deeper way. For example whether the pulses have a square shape approaching the ideal, or an angular (maybe triangular) less ideal shape can provide information as to component quality. Phase noise is also affected by pulse shape as would be understood. The ability to measure pulse shape on-chip brings benefits in that without external instruments that could bring their own inaccuracies. Often simply the act of acquiring a gigahertz pulse for measurement can lead to the introduction of inaccuracies.

Further, there are many advantages of knowing the shape of gigahertz pulses. One direct application is mixer performance. A passive 4-phase mixer requires a 25% duty cycle for good noise and IP2 performance, and its performance depends on the non-overlapping clock as such a clock would degrade both IP2 and noise by way of either not being on or shorting the mixer output. Poor mixer duty cycle will result in sub-optimal noise figure and phase noise. By knowing the shape of the pulses, control can be exerted over the gigahertz pulses, and hence the duty cycle might be optimized, resulting in improved performance for the receiver.

Another advantage of this disclosure is current consumption. It is so important to have 25% duty cycle that the PLL is almost always running at 4× as would be understood the receive frequency, and then divided down to mixer pulses that will guarantee the desired duty cycle as would be understood. By applying the present disclosure, the PLL need only run at 2× the wanted receive frequency. In order for this to be so, both the p and n sides of the VCO are used as would be understood. Such a use of the VCO is not guaranteed to provide symmetrical pulses, however, with the techniques of this disclosure, the properties of signal 13 are measurable and hence can be taken into account. Running the PLL at a lower frequency saves a lot of current, since both the VCO and the dividers of the mixer are typically power hungry.

As discussed, this disclosure has many advantages such as noise, IP2 and calibration. This disclosure also allows architecture change, which will result in current saving at the expense of a minor increase in silicon and/or programmable device area requirement. Three circuit topologies are discussed to show the advantages gained.

(1) As a reference (state-of-the-art), we can assume:
  (a) The VCO is at 10 GHz
  (b) RF is at 2.5 GHz
  (c) Exact 25% duty cycle is achieved by divide by 4
  (d) Current consumption for VCO and buffers/dividers estimated at 30 mA. This is about 70% of the total PLL current consumption of 42 mA.
    Ivco=22 mA.
    Ibuffers/dividers=8 mA.
  (e) Area of inductor and capacitor/varactor: 0.025 mm$^2$, independent of process node. This is about 2.5% of total PLL area of 1 mm$^2$.
    Inductor: 0.02 mm$^2$
    Capacitor/varactor: 0.005 mm$^2$ (2) The disclosed subject matter allows the VCO to run at half frequency, while still guaranteeing 25% duty cycle.
  (a) The VCO is at 5 GHz
  (b) RF is at 2.5 GHz
  (c) 50% duty cycle is achieved by divide by 2
  (d) Rough 25% duty cycle is achieved by pulse generation.
  (e) Exact 25% duty cycle is achieved by measuring duty cycle (this disclosure) and feeding back to pulse generation block.
  (f) Current consumption for both VCO and buffers/dividers will be roughly half, i.e: 15 mA. Total PLL current reduces to 27 mA.
  (g) Current added from the 2×256-Vernier delay cell measurement module is 0.3 mA during around 8 ns. Assuming calibration is needed every second due to temperature drift, the average current will be 0.3 mA*8 ns/1 s=2.4 pA. Total current will be slightly higher due to additional switching current in digital blocks needed for calibration, but the total extra current needed is negligible.
  (h) In a VCO, the resonance frequency is proportional to 1/sqrt(LC). To divide the frequency by 2 and still maintain the VCO performance, one has to double both L and C. The area for the synchronization and measurement modules needs to be added. Total increased area is 0.003, which is 3% of the total PLL area.
    Inductor: 0.04 mm$^2$
    Capacitor/varactor: 0.01 mm$^2$
    Duty-cycle block: 0.005 mm$^2$ (3) Pushing the subject matter of the present disclosure further allows the VCO to run at the same frequency as the RF, while still guaranteeing 25% duty cycle.
  (a) The VCO is at 2.5 GHz
  (b) RF is at 2.5 GHz
  (c) Rough 25% duty cycle is achieved by pulse generation
  (d) Exact 25% duty cycle is achieved by measuring duty cycle (this disclosure) and feeding back to pulse generation block.
  (e) Current consumption for both VCO and buffers/dividers will be roughly one quarter, i.e: 7.5 mA. Total PLL current: 22.5 mA.
  (f) To keep Q constant, L and C has to be four times bigger. Including synchronization and measurement modules the increased area is 0.055, which is 5.5% of the total PLL area.
    Inductor: 0.08 mm$^2$
    Capacitor/varactor: 0.02 mm$^2$
    Synchronization and measurement modules: 0.005 mm$^2$ To summarize, the PLL current and area for the three versions described herein is:

| PLL Current | Current save | % | PLL Area | Area increase | % |
|---|---|---|---|---|---|
| 1. 42.0 mA | — | — | 1 mm2 | — | — |
| 2. 27.0 mA | 15.0 mA | 36% | 1.030 mm2 | 0.030 mm2 | 3.0% |
| 3. 22.5 mA | 22.5 mA | 53% | 1.055 mm2 | 0.055 mm2 | 5.5% |

The various methods described above may be implemented by a computer program product. The computer program product may include computer code arranged to instruct a computer or processor to perform the functions of one or more of the various methods described above. The computer program and/or the code for performing such methods may be provided to an apparatus, such as a computer or a processor, on a computer readable medium or computer program product. The computer readable medium may be transitory or non-transitory. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as semiconductor or solid-state memory, magnetic tape, a removable computer diskette, a random access memory (RAM), a read-only memory (ROM), a rigid magnetic disc, and an optical disk, such as a CD-ROM, CD-R/W or DVD.

An apparatus such as a computer or processor may be configured in accordance with such code to perform one or more processes in accordance with the various methods discussed herein. Such an apparatus may take the form of a data processing system. Such a data processing system may be a distributed system. For example, such a data processing system may be distributed across a network.

The invention claimed is:

1. A duty cycle measuring circuit, the circuit comprising:
a synchronizer and a measurer;
the synchronizer arranged such that when a signal to be measured comprising pulses having a pulse width and a pulse period is input to the synchronizer, synchronizing signals corresponding to each of pulse rising edge, pulse falling edge, pulse period start and pulse period end are output from the synchronizer, each synchronizing signal comprising a rising or falling edge;
wherein the synchronizing signal outputs from the synchronizer are input to the measurer, and wherein the measurer is arranged to provide two measurement outputs based on the synchronizing signal inputs from the synchronizer, the measurement outputs comprising a first measurement output signal indicative of a pulse period measurement of the signal to be measured and a second measurement output signal indicative of a pulse width measurement of the signal to be measured.

2. The duty cycle measuring circuit of claim 1 further comprising a calculator arranged to calculate the duty cycle of the signal to be measured based on the first output signal and the second output signal.

3. The duty cycle measuring circuit of claim 1 wherein the first and second outputs from the measurer each comprise a digital number.

4. The duty cycle measuring circuit of claim 1 wherein the measurer comprises a time to digital converter, TDC circuit.

5. The duty cycle measuring circuit of claim 1 wherein the TDC comprises a plurality of series of cascaded Vernier delay cells, each series coupled to either the pair of pulse edge signals or the pair of pulse period signals of the synchronizing signal inputs to the measurer.

6. The duty cycle measuring circuit of claim 1 wherein the synchronizer comprises a plurality of D-type latches arranged to provide the synchronizing signals corresponding to each of pulse rising edge, pulse falling edge, pulse period start and pulse period end.

7. The duty cycle measuring circuit of claim 6 wherein a series of two cascaded d-type latches, each clocked by the rising edge of the signal to be measured are arranged to provide the signal corresponding to pulse period end from the inverting output of the second d-type latch.

8. The duty cycle measuring circuit claim 6 wherein a d-type latch clocked by the rising edge of the signal to be measured is arranged to provide the signal corresponding to pulse period start from its non-inverting output.

9. The duty cycle measuring circuit of claim 6 wherein a d-type latch clocked by the falling edge of the signal to be measured is arranged to provide the signal corresponding to pulse falling edge from its inverting output.

10. The duty cycle measuring circuit of claim 6 wherein a d-type latch clocked by the rising edge of the signal to be measured is arranged to provide the signal corresponding to pulse rising edge from its non-inverting output via a delay element.

11. A method of measuring the duty cycle of a signal to be measured, the method comprising:

providing to a synchronizer a signal to be measured comprising pulses having a pulse width and a pulse period;
outputting from the synchronizer synchronizing signals corresponding to each of pulse rising edge, pulse falling edge, pulse period start and pulse period end, each synchronizing signal comprising a rising or falling edge;
providing the synchronizing signal outputs to a measurer, the measurer providing two measurement outputs based on the synchronizing signal inputs from the synchronizer, the measurement outputs comprising a first measurement output signal indicative of a pulse period measurement of the signal to be measured and a second measurer signal indicative of a pulse width measurement of the signal to be measured.

12. The method of claim 11 calculating, by a processor, the duty cycle of the signal to be measured based on the first output signal and the second output signal.

13. The method of claim 11 wherein providing the two measurement outputs comprises providing a first measurement output signal indicative of a pulse period measurement and a second measurement output signal indicative of a pulse width measurement, each comprising a digital number.

14. The method of claim 11 further comprising providing a TDC comprising a plurality of series of cascaded Vernier delay cells each series coupled to either the pair of pulse edge signals or the pair of pulse period signals of the synchronizing signal inputs to the measurer.

15. The method of claim 11 wherein the synchronizer comprises providing a plurality of D-type latches arranged to provide the synchronizing signals corresponding to each of pulse rising edge, pulse falling edge, pulse period start and pulse period end.

16. The method of claim 15 wherein the synchronizer comprises providing a series of two cascaded d-type latches, each clocked by the rising edge of the signal to be measured, the series arranged to provide the signal corresponding to pulse period end from the inverting output of the second d-type latch.

17. The method of claim 15 wherein the synchronizer comprises providing a d-type latch clocked by the rising edge of the signal to be measured to provide the signal corresponding to pulse period start from its non-inverting output.

18. The method of claim 15 wherein the synchronizer comprises providing a d-type latch clocked by the falling edge of the signal to be measured to provide the signal corresponding to pulse falling edge from its inverting output.

19. The method of claim 15 wherein the synchronizer comprises providing a d-type latch clocked by the rising edge of the signal to be measured to provide the signal corresponding to pulse rising edge from its non-inverting output via a delay element.

20. A non-transitory computer readable medium comprising instructions that when executed by a processor, cause the processor to carry out the method of claim 11.

* * * * *